United States Patent
Schenk et al.

(10) Patent No.: US 12,055,705 B2
(45) Date of Patent: Aug. 6, 2024

(54) METHOD FOR CONTROLLING A DRIVE APPARATUS OF A MICRO-OSCILLATION MIRROR, CONTROL DEVICE AND DEFLECTOR MIRROR APPARATUS

(71) Applicant: Valeo Schalter und Sensoren GmbH, Bietigheim-Bissingen (DE)

(72) Inventors: Jochen Schenk, Bietigheim-Bissingen (DE); Michael Kleiser, Bietigheim-Bissingen (DE); Jürgen Nies, Bietigheim-Bissingen (DE); Frank Selbmann, Bietigheim-Bissingen (DE); Felix Müller, Bietigheim-Bissingen (DE)

(73) Assignee: VALEO SCHALTER UND SENSOREN GMBH, Bietigheim-Bissingen (DE)

( * ) Notice: Subject to any disclaimer, the term of this patent is extended or adjusted under 35 U.S.C. 154(b) by 671 days.

(21) Appl. No.: 17/283,835

(22) PCT Filed: Oct. 7, 2019

(86) PCT No.: PCT/EP2019/077028
§ 371 (c)(1),
(2) Date: Apr. 8, 2021

(87) PCT Pub. No.: WO2020/074416
PCT Pub. Date: Apr. 16, 2020

(65) Prior Publication Data
US 2021/0382298 A1    Dec. 9, 2021

(30) Foreign Application Priority Data
Oct. 10, 2018  (DE) .................. 10 2018 124 964.0

(51) Int. Cl.
*G02B 26/08*      (2006.01)
*B81B 3/00*       (2006.01)
(Continued)

(52) U.S. Cl.
CPC ........ *G02B 26/0841* (2013.01); *B81B 3/0018* (2013.01); *B81B 2201/045* (2013.01); *G01S 7/4817* (2013.01); *G01S 17/931* (2020.01)

(58) Field of Classification Search
CPC ............. G02B 26/0841; G02B 26/105; B81B 3/0018; B81B 2201/045; G01S 7/4817; G01S 17/931; G01S 7/497
See application file for complete search history.

(56) References Cited

U.S. PATENT DOCUMENTS

| | | | |
|---|---|---|---|
| 5,837,885 A | 11/1998 | Goodbread et al. | |
| 5,959,760 A | 9/1999 | Yamada et al. | |

(Continued)

FOREIGN PATENT DOCUMENTS

| | | | |
|---|---|---|---|
| DE | 10318069 A1 | 11/2004 | |
| DE | 102008049647 A1 | 4/2010 | |

(Continued)

OTHER PUBLICATIONS

International Search Report and Written Opinion in corresponding International Application No. PCT/EP2019/077028, mailed Jan. 8, 2020 (10 pages).

(Continued)

*Primary Examiner* — Euncha P Cherry
(74) *Attorney, Agent, or Firm* — Osha Bergman Watanabe & Burton LLP

(57) ABSTRACT

A method for controlling a drive apparatus (20) of a micro-oscillation mirror (16), a control device (28) and a deflector mirror apparatus (14) are described. The drive apparatus (20) has at least two comb drives (22a, 22b) which are (Continued)

arranged on different radial sides of a pivoting axis (18) of the micro-oscillation mirror (16). In the method, at least two actuation signals AS1, AS2) are generated, and the at least two comb drives (22a, 22b) are therefore actuated at least temporarily in such a way that they drive the micro-oscillation mirror (16) in an oscillating fashion. At least one elongation signal (P1, P2), which characterizes the elongation (26) of the micro-oscillation mirror (16) is generated using at least one comb drive (22a, 22b). At least one of the actuation signals (AS1, AS2) is adapted to the oscillation of the micro-oscillation mirror (16) on the basis of at least one of the elongation signals (P1, P2), At least one of the comb drives (22a, 22b) is connected, by means of at least one switching apparatus (34), alternately to an actuation apparatus (32) for receiving at least one actuation signal (AS1, AS2) or to an elongation-detection apparatus (24) for generating at least one elongation signal (P1, P2).

14 Claims, 3 Drawing Sheets

(51) Int. Cl.
  *G01S 7/481* (2006.01)
  *G01S 17/931* (2020.01)

(56) References Cited

U.S. PATENT DOCUMENTS

| | | |
|---|---|---|
| 2010/0043551 A1 | 2/2010 | Geen et al. |
| 2010/0296146 A1 | 11/2010 | Krastev et al. |
| 2011/0109951 A1 | 5/2011 | Goren et al. |
| 2012/0307211 A1* | 12/2012 | Hofmann ............ G02B 26/101 |
| | | 353/31 |

FOREIGN PATENT DOCUMENTS

| | | |
|---|---|---|
| DE | 102009058762 A1 | 6/2011 |
| EP | 2208103 B1 | 2/2013 |
| JP | 2005-266054 A | 9/2005 |

OTHER PUBLICATIONS

German Search Report in corresponding German Application No. 10 2018 124 964.0, dated Apr. 26, 2019 (7 pages).

Moore Steven Ian et al.: "A switched actuation and sensing method for a MEMS electrostatic drive", 2016 American Control Conference (ACC), American Automatic Control Council (AACC), Jul. 6, 2016 (Jul. 6, 2016), Seiten 5817-5822, XP032933597, DOI: 10.1109/ACC.2016.7526581 (7 pages).

* cited by examiner

METHOD FOR CONTROLLING A DRIVE APPARATUS OF A MICRO-OSCILLATION MIRROR, CONTROL DEVICE AND DEFLECTOR MIRROR APPARATUS

TECHNICAL FIELD

The invention relates to a method for controlling a drive apparatus of a micro-oscillation mirror, wherein the drive apparatus has at least two comb drives which are arranged on different radial sides of a pivoting axis of the micro-oscillation mirror, wherein in the method:
- at least two actuation signals are generated, and the at least two comb drives are therefore actuated at least temporarily in such a way that they drive the micro-oscillation mirror in an oscillating fashion,
- at least one elongation signal which characterizes the elongation of the micro-oscillation mirror is generated using at least one comb drive,
- at least one of the actuation signals is adapted to the oscillation of the micro-oscillation mirror on the basis of at least one of the elongation signals.

In addition, the invention relates to a control device for controlling at least one drive apparatus of a micro-oscillation mirror, wherein the at least one drive apparatus has at least two comb drives which are arranged on different radial sides of a pivoting axis of the micro-oscillation mirror,
- having at least one actuation apparatus for actuating the at least two comb drives using actuation signals,
- having at least one elongation-detection apparatus with which at least one elongation signal which characterizes the elongation of the micro-oscillation mirror can be determined,
- and having at least one apparatus which is connected in a controllable fashion to the at least one actuation apparatus such that at least one of the actuation signals can be adapted to the oscillation frequency of the micro-oscillation mirror on the basis of at least one of the elongation signals.

Furthermore, the invention relates to a deflector mirror apparatus of an optical detection apparatus, having
- at least one micro-oscillation mirror,
- at least one drive apparatus for the at least one micro-oscillation mirror, wherein the drive apparatus has at least two comb drives which are arranged on different radial sides of a pivoting axis of the micro-oscillation mirror, and
- a control device for controlling the at least one drive apparatus, wherein the control device has
- at least one actuation apparatus for actuating the at least two comb drives using actuation signals,
- at least one elongation-detection apparatus with which at least one elongation signal which characterizes the elongation of the micro-oscillation mirror can be determined,
- and at least one apparatus which is connected in a controllable fashion to the at least one actuation apparatus such that at least one of the actuation signals can be adapted to the oscillation frequency of the micro-oscillation mirror on the basis of at least one of the elongation signals.

PRIOR ART

DE 10 2009 058 762 A1 has disclosed a two-axle, cardanically suspended micro-mirror. Electrostatic comb drives remote from the axle and comb drives near to the axle are illustrated, which comb drives can also be used as sensor electrodes. A mirror plate is suspended by means of torsion springs in a movable frame which is in turn suspended by means of torsion springs in a fixed chip frame. The frame can be made to resonate by electrostatic comb drives So that the mirror can also be tracked even when its resonant frequency changes, an actuation device has a phase-locked loop which adjusts the phase and therefore the actuation frequency of the actuation signals in such a way that the mirror operates essentially at resonance. In order to sense the phase angle, a measuring device is provided which measures the sinusoidal elongation of the micro-mirror. In capacitive evaluation methods, the capacitance which can vary over time and is dependent on the tilting angle, between the static and movable sensor electrode fingers, is evaluated. For this purpose, a high-frequency-modulated voltage is applied to the sensor comb structures. The movement of the finger-shaped capacitances generates a capacitive current, of which the signal form constitutes an amplitude modulation of the carrier signal. The information about the mirror movement is contained in the amplitude modulation and can be extracted by multiplication (mixing) and filtering.

The invention is based on the object of configuring a method, a control device and a deflected mirror apparatus in which the micro-oscillation mirror can be driven better, in particular more efficiently in respect of energy and/or with lower susceptibility to faults. In particular, a transient recovery time of the micro-oscillation mirror is to be shortened

DISCLOSURE OF THE INVENTION

The object is achieved according to the invention with the method in that at least one of the comb drives is connected, by means of at least one switching apparatus alternately to an actuation apparatus for receiving at least one actuation signal or to an elongation-detection apparatus for generating at least one elongation signal.

According to the invention, at least one of the comb drives is therefore alternately used for driving the micro-oscillation mirror or for detecting the elongation of the micro-oscillation mirror, that is to say the instantaneous deflection of the micro-oscillation mirror Therefore, at least one of the at least two comb drives is used both for driving the micro-oscillation mirror and for determining the elongation of the micro-oscillation mirror. The second of the at least two comb drives is used at least to drive the micro-oscillation mirror. In this way, at least during the transient recovery time, the energy required for driving can be transmitted more efficiently to the micro-oscillation mirror with the comb drives. The term transient recovery time is used to refer to the time after the drive of the micro-oscillation mirror is switched on until said drive oscillates sufficiently uniformly for its use, in particular with its resonant frequency.

In order to switch over, at least one switching apparatus is used, by means of which at least one of the comb drives can be alternately connected to a corresponding actuation branch of the drive apparatus or to a corresponding elongation-detection branch of the elongation-detection apparatus.

The elongation of the micro-oscillation mirror is characterized by at least one elongation signal. The at least one elongation signal is generated using the elongation-detection apparatus on the basis of a variable which is generated with the corresponding comb drive, in particular a comb capacitance or an electric current. In this way, a chronological progression of the at least one elongation signal can characterize the chronological progression of the elongation of the micro-oscillation mirror.

At least two actuation signals are generated. The at least two actuation signals are used to actuate the at least two comb drives at least temporarily in such a way that they drive the micro-oscillation mirror in an oscillating fashion. At least two of the at least two actuation signals can be from the same source. In particular, at least two of the at least two actuation signals can be generated from a common source signal. The common source signal can be assigned, in particular by means of a corresponding switching means, for example logic modules or the like, either to one of the comb drives as one of the actuation signals or to another of the comb drives as another actuation signal. Alternatively, at least two of the at least two actuation signals can be from a different source. In particular, the at least two actuation signals can be generated, in particular, with at least partially separate means, in particular from different source signals. The at least two actuation signals can also be formed directly from different source signals.

At least one of the actuation signals is regulated on the basis of at least one of the elongation signals in such a way that the at least one actuation signal is adapted to the oscillation, in particular the oscillation frequency, of the micro-oscillation mirror. The micro-oscillation mirror can advantageously be driven with the drive apparatus as far as possible at its resonant frequency. At the resonant frequency, the micro-oscillation mirror can be driven efficiently. The regulation of the at least one actuation signal can be used to compensate tolerances with respect to the resonant frequency of the micro-oscillation mirror and/or changes in the resonant frequency of the micro-oscillation mirror during operation, in particular during the transient recovery phase.

A comb drive has, as is known, at least one comb electrode structure which can be excited to move by correspondingly applying an electrical voltage. In this context, some of the electrode fingers of the comb electrode structure are connected to the micro-oscillation mirror, and others are connected to a fixed frame of the micro-oscillation mirror. The finger electrodes on the micro-oscillation mirror engage in the intermediate spaces between the finger electrodes on the frame. Applying the corresponding electrical voltage in the form of a drive signal causes the finger electrodes on the micro-oscillation mirror to be deflected relative to the finger electrodes on the frame, and the micro-oscillation mirror is therefore driven to oscillate relative to the frame.

The driven micro-oscillation mirror can advantageously carry out an approximately sinusoidal oscillation. In this context, the micro-oscillation mirror can be driven actively in one oscillation direction with one of the comb drives, and in the opposite oscillation direction, that is to say the direction of the return oscillation, with the other of the at least two comb drives. The drive of the micro-oscillation mirror is triggered by the respective actuation signals. After a drive pulse of the corresponding actuation signal has been removed, the micro-oscillation mirror is deflected owing to its inertia until its corresponding amplitude is reached. During the oscillation of the micro-oscillation mirror, an elastic resetting apparatus, in particular in the form of a resetting spring, preferably a torsion spring, can be pre-stressed. The resetting apparatus can be part of the drive apparatus. After the amplitude has been reached, the micro-oscillation mirror can be swung back by means of the resetting device, and in the process driven in a corresponding time window by means of the respective other comb drive. After the oscillation through the zero position, the micro-oscillation mirror continues its movement up to the next amplitude which is opposed to the above-mentioned amplitude.

By virtue of the drive using two comb drives on different radial sides of the pivoting axis of the micro-oscillation mirror, it is possible to introduce the required energy more efficiently, at least during the transient recovery process. In this context, the micro-oscillation mirror and/or the comb drives can be prevented from being damaged by excessively fast excitation of the micro-oscillation mirror on one side.

A change in capacitance, in particular of a comb electrode structure of at least one comb drive, can be advantageously used to determine the elongation of the micro-oscillation mirror. At least one elongation signal which characterizes the elongation can be determined from the change in capacitance.

The micro-oscillation mirror can advantageously be part of an optical detection device for detecting objects.

The optical detection device can advantageously be a scanning system, in particular a laser scanner. In this context, a monitoring region can be sampled, that is to say, scanned, with transmission signals. For this purpose, the corresponding transmission signals, in particular transmission beams, can, as it were, be pivoted with respect to their propagation direction over the monitoring region. In this context, at least one deflector mirror apparatus can be used, which can contain at least one micro-oscillation mirror with a corresponding control device and a corresponding drive apparatus.

The invention can be used in a vehicle, in particular a motor vehicle. The invention can advantageously be used in a land-based vehicle, in particular a passenger vehicle, a lorry, a bus, a motorcycle or the like, an aircraft and/or a watercraft. The invention can also be used in autonomous, or partially autonomous, vehicles.

The detection device can advantageously be connected to at least one electronic control device of a vehicle, in particular a driver assistance system and/or a chassis control system and/or a driver information apparatus and/or a parking assistance system or the like or can be part of such a device, system or apparatus.

In one advantageous refinement of the method, one of the at least two comb drives can alternately be connected to the actuation apparatus, while another one of the at least two comb drives is connected to an elongation-detection apparatus, and vice versa. In this way, the micro-oscillation mirror can be driven with one of the comb drives in each direction of oscillation. In addition, the elongation of the micro-oscillation mirror can be detected with one of the comb drives in any oscillation direction. It is therefore possible to continuously both drive the micro-oscillation mirror and detect elongation. In this way, the overall transient recovery time of the micro-oscillation mirror can be shortened.

The overall supply of energy can be increased through driving with the comb drives on different sides of the micro-oscillation mirror. This contributes to shortening the transient recovery time. The most favourable time for removing the comb drives can be detected by determining the elongation using respective elongation signals. It is therefore possible to prevent the comb drives from decelerating the oscillation of the micro-oscillation mirror. For this purpose, the corresponding comb drive can be deactivated in terms of drive with the corresponding actuation signal before the amplitude is reached. No drive is carried out with the comb drives directly before those amplitudes of the oscillation of the micro-oscillation mirror, at which a reversal of the direction of oscillation takes place, are reached.

The at least one actuation signal can advantageously be switched on during approximately a quarter of the period length of the oscillation of the micro-oscillation mirror. In this time window, the at least one actuation signal can actuate the corresponding comb drive in a driving fashion. Owing to the comb electrode structure of the comb drive, the micro-oscillation mirror can be driven in this way only in a correspondingly small angular range of its elongation. The micro-oscillation mirror requires a correspondingly longer time until it reaches its amplitude. As a result of the activation of the second comb drive when the micro-oscillation mirror experiences a return oscillation, it is therefore possible to lengthen overall the time in which the comb drives act in a driving fashion on the micro-oscillation mirror in comparison with the period length of the oscillation.

In one advantageous refinement of the method, at least one switching signal can be generated or specified, with which signal the at least one switching apparatus can be switched. In this way, the switching times of the switching apparatus can be controlled more precisely.

The switching apparatus can advantageously have at least one switch. The at least one switch can be what is referred to as a changeover switch.

A changeover switch can be used to connect at least one comb drive to the actuation apparatus, while the connection of this at least one comb drive to the corresponding elongation detection-apparatus is disconnected, and vice versa. In this way, the switching over of at least one comb drive can be carried out with just one switch.

The switching apparatus can alternately have at least two switches. A connection between at least one comb drive and the actuation apparatus can be switched with at least one of the at least two switches. A connection between at least one comb drive and the elongation-detection apparatus can be switched with at least one other of the at least two switches. In this way, the switching times for the connection to the actuation apparatus and the connection to the elongation-detection apparatus can be set separately from one another.

The switching signals can advantageously be implemented by means of software and/or hardware technology. The switching signals can advantageously be implemented electronically. In this way, they can be set easily and precisely.

In a further advantageous refinement of the method, the connections between the at least one comb drive, on the one hand, and the actuation apparatus or the elongation-detection apparatus, on the other, can be switched as a function of at least one elongation signal. In this way, a start and an end of a drive phase of the at least one comb drive can be adapted more precisely to the elongation of the micro-oscillation mirror.

In a specific oscillation phase of the micro-oscillation mirror, the at least one actuation signal can be applied to the comb drive for the purpose of driving. The oscillation phase can be detected using at least one elongation signal.

In a further advantageous refinement of the method, at least one comb drive can alternately be connected to an actuation branch, allocated thereto, of the actuation apparatus, or, under certain circumstances, to an elongation-detection branch, allocated to this comb drive, of the elongation-detection apparatus. In this way, the actuation branches and the elongation-detection branches can be individually adapted to the respective comb drives. In particular in comb drives which are arranged or configured asymmetrically with respect to the pivoting axis of the micro-oscillation mirror, the corresponding actuation branches and elongation-detection branches can therefore be adapted individually With the invention it is therefore also possible to carry out more precise control of comb drives which are not arranged or configured symmetrically with respect to the pivoting axis of the micro-oscillation mirror.

An actuation branch of the actuation apparatus can advantageously be provided in a double design. Therefore, in each case one of the actuation branches can be used for one of the comb drives.

Alternatively or additionally, an elongation-detection branch can advantageously be provided in a double design. Therefore, in each case one of the elongation-detection branches can be used for one of the comb drives.

At least one switching apparatus, in particular corresponding switches, can connect the at least two comb drives in an alternating fashion to their respective actuation branch or to their respective elongation-detection branch. The time windows for the supply of energy can be set better by means of a suitable phase shift of the actuation signals. A sequence for switching the actuation branches and the elongation-detection branches can be specified by means of a corresponding apparatus, in particular an integrated circuit, for example in the form of an FPGA module. With this device it is possible to specify or generate corresponding switching signals for switching the at least one switching apparatus.

In a further advantageous refinement of the method, at least one comb drive can be actuated with at least one actuation signal between two amplitudes of the oscillation of the micro-oscillation signal. In this way, energy for acceleration can be fed to the micro-oscillation mirror in the oscillation phases with the at least one comb drive, before said mirror reaches its highest oscillation speed, specifically before it reaches its zero position or position of rest.

At least one actuation signal for driving the at least one comb drive can advantageously be switched off when the comb electrode structures of the at least one comb drive engage completely with one inside the other. In this way it is possible to prevent the micro-oscillation mirror from oscillating in a decelerated fashion. The at least one comb drive can be switched off in respect of its drive function before the micro-oscillation mirror reaches its zero position or position of rest. The comb electrode structures of the at least one comb drive can be configured in such a way that they engage completely with one inside the other in the zero position or position of rest of the micro-oscillation mirror.

Alternatively, the comb electrode structures may not engage completely with one inside the other in the zero position or position of rest of the oscillation mirror. The comb electrode structures can thus be prevented from being located at the dead centre when the comb driver is started.

In a further advantageous refinement of the method, at least one comb drive can be actuated with at least one actuation signal in a driving fashion until a measurement variable following the actuation signal reaches a specifiable limiting value. In this way, a suitable time for switching off the actuation signal can be determined from the actuation signal itself.

At least one actuation signal can advantageously be created in the form of an electrical voltage at the at least one comb drive. The electrical voltage is followed by an electric current as a function of the comb capacitance of the at least one comb drive. The electric current can be measured. The electric current can increase until the comb capacitance of the at least one comb drive reaches its maximum. In this way, the corresponding elongation signal can be generated on the basis of said measurement variable, in particular the electric current.

The progression of said measurement variable, in particular of the electric current, can be measured and/or evaluated, in particular with a high-speed analogue/digital converter.

In a further advantageous refinement of the method, after a transient recovery time of the micro-oscillation mirror, at least one of the comb drives can be used exclusively to drive the micro-oscillation mirror, and/or at least one of the comb drives can be used exclusively to detect the elongation of the micro-oscillation mirror. In this way, the supplied energy can be reduced after the transient recovery time. In this way, it is also possible to reduce the risk of operational disruption.

After the transient recovery time, it is sufficient merely to feed the energy to maintain the oscillation. The comb drive which is not required to supply energy can be used exclusively to detect the elongation of the micro-oscillation mirror. Overall, it is therefore possible to simplify the control after the transient recovery time.

In a further advantageous refinement of the method, while at least one comb drive is actuated in a driving fashion with at least one actuation signal, an electric comb current of the at least one comb drive is determined as a variable which characterizes a position of comb electrode structures of the at least one comb drive. In this way, while the at least one comb drive is being operated in the drive mode, the ideal time for switching the at least one actuation signal on and/or off can be determined from the comb current. In this way, the at least one actuation signal can also be controlled in operating phases in which the at least one comb drive is operated exclusively in the drive mode.

In the drive mode, the corresponding comb drive is actuated in a driving fashion with at least one actuation signal. In contrast to this, in the elongation-detection mode at least one elongation signal is generated with the corresponding comb drive.

The comb current can be advantageously measured against earth using at least one ohmic resistor, in particular a shunt. In this way, the comb current can be determined with simple means. The ohmic resistor can be arranged between one of the comb electrode structures and earth. If appropriate, the ohmic resistor can be arranged between a signal generator, which is connected to the comb electrode structure and with which the at least one actuation signal is output, and earth.

The comb current can advantageously be converted into digital data. For this purpose, an analogue/digital converter can be advantageously provided. The digital data can be evaluated with corresponding electrical components, in particular an FPGA module.

The comb current can advantageously be used to control at least one actuation signal. In this way, the at least one actuation signal can be started and ended at the ideal time. The ideal time to switch off the at least one actuation signal so that the micro-oscillation mirror is not decelerated again is the moment at which the comb electrode structures of the at least one comb drive engage completely with one inside the other. At this time, the comb capacitance is at its highest.

During a transient recovery phase of the micro-oscillation mirror, at least one comb drive can be advantageously operated exclusively in the drive mode, and the comb current can be determined. In this way, the transient recovery process of the micro-oscillation mirror can be accelerated.

A position of the comb electrode structures of the at least one comb drive can be advantageously determined from the comb current. Elongation of the micro-oscillation mirror can be determined from the position of the comb electrode structures.

The at least one comb drive can be advantageously connected to the elongation-detection apparatus after a specifiable or specified number of oscillation periods of the micro-oscillation mirror. In this way, the oscillation frequency of the micro-oscillation mirror can be approximated to its resonant frequency using the elongation-detection apparatus.

In addition, the object is achieved according to the invention with the control device by virtue of the fact that the control device has at least one switching apparatus with which at least one comb drive can be alternately connected to the at least one actuation apparatus or to the at least one elongation-detection apparatus. In this way, the excitation of the micro-oscillation mirror to oscillate can be carried out more efficiently and quickly. The transient recovery time can be shortened in this way.

If the at least two comb drives are arranged and configured symmetrically with respect to the oscillation axis, both comb drives can be correspondingly switched to provide drive or to detect elongation with just one actuation branch of the actuation apparatus and just one elongation-detection branch of the elongation-detection apparatus. The comb drives can be connected in parallel in this case, permitting overall simplification of the switching.

The control device for controlling the drive apparatus can advantageously have a field programmable gate array (FPGA) or some other integrated circuit.

In one advantageous embodiment, at least one switching apparatus has at least one switch and the control device has at least one switching signal-generating device with which at least one switching signal for switching the at least one switch can be generated.

In this way, easy and precise switching over of the at least one comb drive between its drive function and its elongation-detection function can be implemented.

The control device can advantageously have at least one signal generator for generating at least one actuation signal. In this way, the at least one actuation signal can be implemented with simple means.

The at least one signal generator can be advantageously controlled in accordance with at least one switching signal-generating device and/or can be capable of being controlled thereby. In this way, the at least one signal generator can be controlled in accordance with and/or as a function of switching signals with which the at least one switching apparatus is switched.

The elongation-detection apparatus, the control device, the actuation apparatus and/or the switching signal-generating device can advantageously be implemented by means of software and/or hardware technology. Said apparatuses and devices can be implemented using electrical/electronic and/or mechanical components.

In addition, the object is achieved according to the invention with the deflector mirror apparatus by virtue of the fact that the control device has at least one switching apparatus with which at least one comb drive can be alternately connected to the at least one actuation apparatus or to the at least one elongation-detection apparatus. In this way, the excitation of the micro-oscillation mirror to oscillate can be carried out more efficiently and quickly. The transient recovery phase can be shortened in this way.

Moreover, the features and advantages indicated in connection with the method according to the invention, the control device according to the invention and the deflector mirror apparatus according to the invention and the respective advantageous configurations thereof apply here in a mutually corresponding manner and vice versa. The individual features and advantages can of course be combined with one another, wherein further advantageous effects can occur that go beyond the sum of the individual effects.

BRIEF DESCRIPTION OF THE DRAWINGS

Further advantages, features and details of the invention are apparent from the following description, in which exemplary embodiments of the invention will be explained in more detail with reference to the drawing. A person skilled in the art will also expediently consider the features which have been disclosed in the drawing, the description and the claims individually and combine them to form further meaningful combinations. In the drawing:

In the figures, identical components are provided with the same reference numerals.

EMBODIMENT(S) OF THE INVENTION

Figure 1:
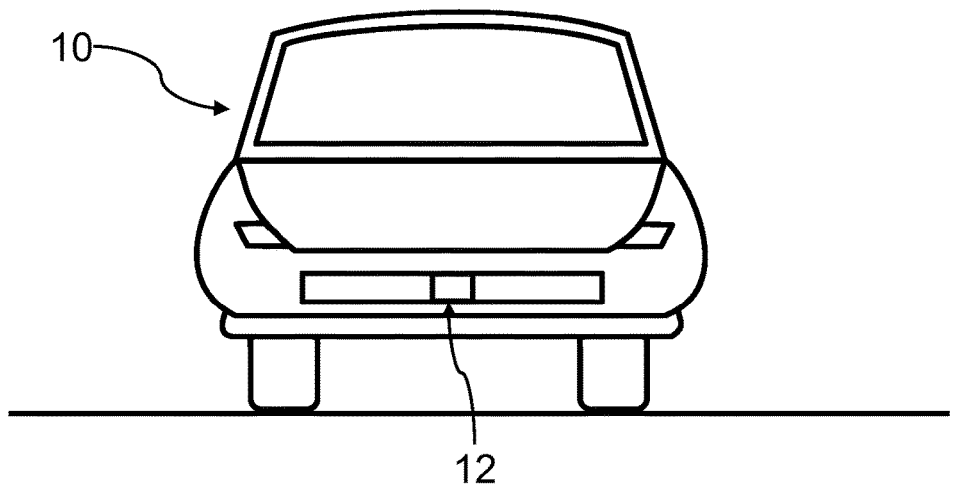
FIG. 1 shows a front view of a vehicle with a laser scanner for monitoring a monitoring region ahead of the vehicle in the direction of travel.

FIG. 1 illustrates a vehicle by way of example in the form of a passenger vehicle in a front view. The vehicle 10 comprises a scanning optical detection device by way of example in the form of a laser scanner 12. The laser scanner 12 is arranged by way of example in the front bumper of the vehicle 10. The laser scanner 12 can also be arranged at another location on the vehicle 10.

The laser scanner 12 can be used to monitor for objects in a monitoring region, for example in front of the vehicle 10 in the direction of travel of the vehicle 10. For this purpose, the monitoring region can be scanned with corresponding transmission signals using the laser scanner 12. When an object is present, the transmission signals are reflected and sent back to the laser scanner 12. The reflected signals are received with a corresponding receiver of the laser scanner 12.

The laser scanner 12 operates according to what is referred to as a propagation time method in which a propagation time between the emission of a transmission signal and the reception of a reflected transmission signal can be sensed, and a distance, speed and/or a direction of the object relative to the vehicle 10 can be determined therefrom.

The laser scanner 12 has a transmitter for emitting transmission signals, a receiver for receiving the reflected transmission signals, a deflector mirror apparatus 14 for deflecting the transmission signals and a control and evaluation apparatus for controlling the transmitter, the receiver and the deflector mirror apparatus 14 and for evaluating received signals. The beam directions of the transmission signals in the monitoring region are pivoted with the deflector mirror apparatus 14 so that the latter can be scanned with the transmission signals.

Figure 2:
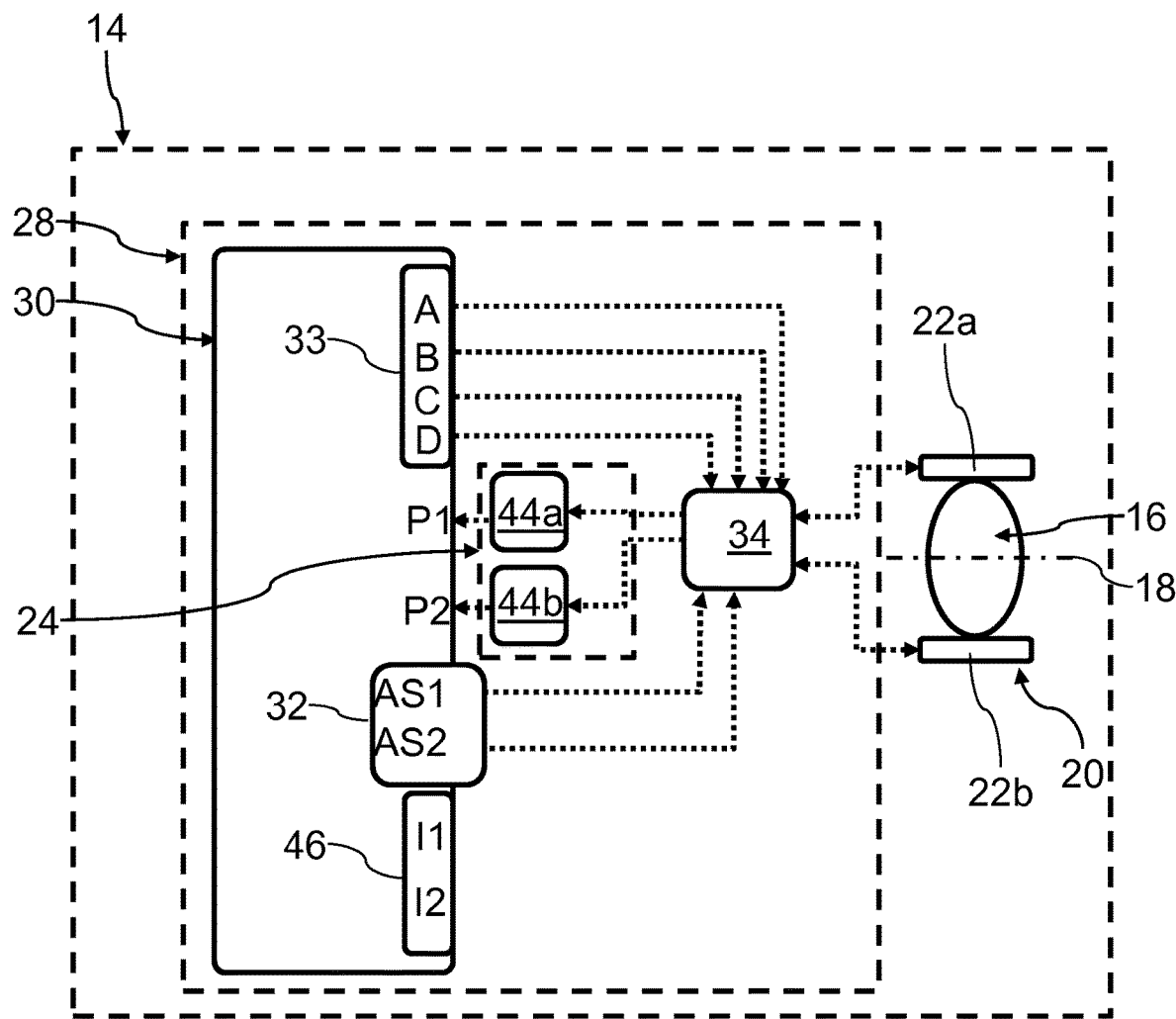
FIG. 2 shows a circuit design of a deflector mirror apparatus of the laser scanner from FIG. 1 with a micro-oscillation mirror and a control device for a drive apparatus of the micro-oscillation mirror.

FIG. 2 shows a circuit design of the deflector mirror apparatus 14. The deflector mirror apparatus 14 comprises a micro-oscillation mirror 16. The micro-oscillation mirror 16 is configured as what is referred to as a micro-system component which is referred to as a micro-electromechanical system (MEMS). The micro-oscillation mirror 16 can be pivoted to and fro about a pivoting axis 18, between amplitudes, that is to say maximum deflections.

The micro-oscillation mirror 16 can be connected to a drive apparatus 20. The drive apparatus 20 has two so-called comb drives 22a, 22b with which the micro-oscillation mirror 16 can be driven. The comb drives 22a, 22b can also be used, in addition to use in sensors, to detect an elongation 26, thus an instantaneous deflection, of the micro-oscillation mirror 16.

The comb drives 22a, 22b are operated with electrical voltage. The comb drives 22a, 22b are equipped for example with interacting comb electrode structures which can be actuated by applying a respective actuation signal AS1 or AS2. The time progression of the first actuation signal AS1 for actuating the first comb drive 22a is shown for example by a dotted line in FIG. 3. The time progression of the second actuation signal AS2 for actuating the second comb drive 22a is indicated by dot dash lines only for the purpose of orientation.

In addition, the deflector mirror apparatus 14 has an elongation-detection apparatus 24 with which the elongation 26 can be sensed in respect of its time progression. For this, the elongation-detection apparatus 24 uses the comb electrode structures of the comb drives 22a and 22b. In this context, a charging and discharging current is sensed in a changing comb capacitance of the respective comb drive 22a or 22b. The comb capacitance and therefore the charging and discharging current change owing to the oscillation of the micro-oscillation mirror 16. The change in capacitance is converted into a proportional electrical voltage, wherein the frequency of the voltage, the oscillation frequency of the micro-oscillation mirror 16 and the change in amplitude of the voltage is a measure of the elongation 26 of the micro-oscillation mirror 16. The comb capacitance which is converted into a change in amplitude is output as a corresponding elongation signal P1 or P2. The elongation signals P1 and P2 characterize the elongation 26 of the micro-oscillation mirror 16 in respect of the time progression. The time progression of the first elongation signal P1, which is determined using the first comb drive 22a, is shown by way of example in FIG. 3.

Figure 3:
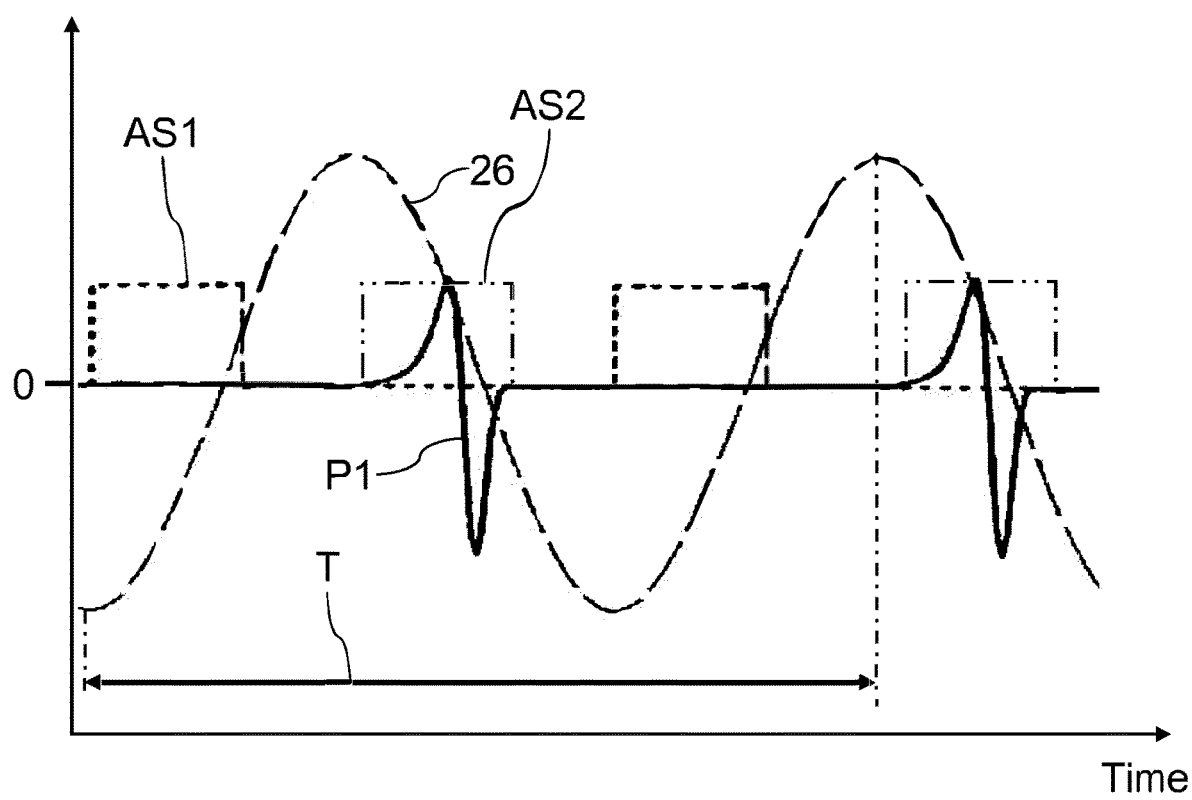
FIG. 3 shows time progressions of an actuation signal for actuating the drive apparatus, elongation of the micro-oscillation mirror and an elongation signal which characterizes the time progression of the elongation of the micro-oscillation mirror.

In FIG. 3, for example the time progression of the elongation 26 of the micro-oscillation mirror 16 is illustrated as a sine curve, the time progression of the first actuation signal AS1 for the first comb drive 22a is illustrated in the form of a periodic square-wave signal, and the time progression of the first elongation signal P1, which is generated using the first comb drive 22a, is illustrated in the form of a periodic bipolar pulse. The illustration in FIG. 3 serves merely the purpose of comparison of the time progressions of the first actuation signal AS1, of the first elongation signal P1 and of the elongation 26. Other measures and units do not correspond.

The actuation signals AS1 and AS2 are adapted to the oscillation frequency of the micro-oscillation mirror 16 on the basis of the elongation signals P1 and P2. This ensures that the micro-oscillation mirror 16 is as far as possible driven at its resonant frequency.

In order to actuate the drive apparatus 20 or the comb drives 22a and 22b, a control device 28 is provided. The control device 28 has, for example, what is referred to as an FPGA module 30.

Figure 4:
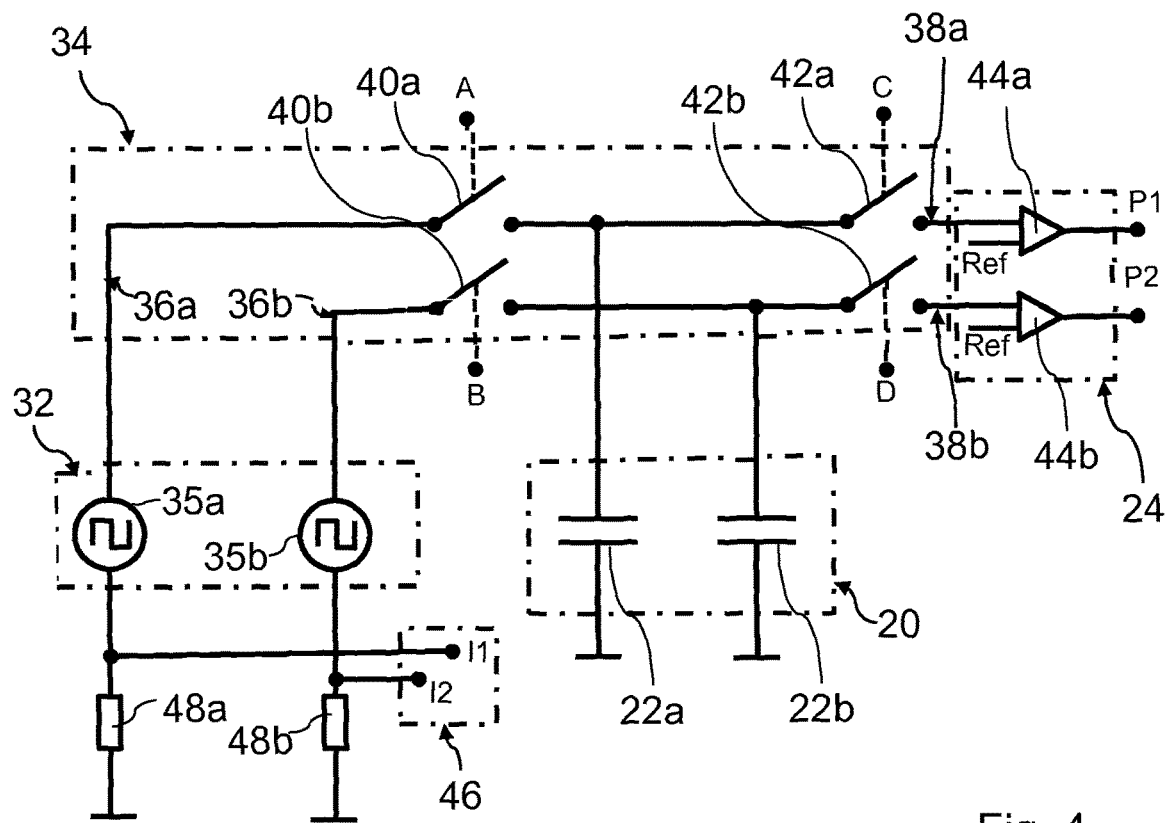
FIG. 4 shows a circuit design of part of the control device with a switching apparatus for the drive apparatus of a micro-oscillation mirror from FIG. 2.

The FPGA module 30 comprises an actuation apparatus 32 as a part. The actuation apparatus 32 also has two signal generators 35a and 35b which are shown in FIG. 4, for generating the actuation signals AS1 and AS2.

In addition, the FPGA module 30 comprises a switching signal-generating device 33 with which switching signals A, B, C and D, to be described in greater detail below, can be generated.

In addition, the actuation signals AS1 and AS2 and the switching signals A, B, C and D can be regulated with the FPGA module 30 on the basis of the elongation signals P1 and P2.

Furthermore, the FPGA module 30 optionally comprises a comb position-detection apparatus 46 The comb current I1 of the first comb drive 22a can be determined with the comb position-detection apparatus 46 as long as said comb drive 22a is in the drive mode. In addition, the comb current I2 of the second comb drive 22b can be determined with the comb position-detection apparatus 46 as long as said comb drive 22b is in the drive mode. The positions of the comb electrode structures of the corresponding comb drives 22a and 22b can be determined from the comb currents I1 and I2

The actuation apparatus 32 and the switching signal-generating device 33 are connected in a signal-transmitting fashion to the elongation-detection apparatus 24 and a switching apparatus 34. The comb drives 22a and 22b can each alternately be connected to the actuation apparatus 32 or the elongation-detection apparatus 24 with the switching apparatus 34.

The switching apparatus 34 is shown in detail in FIG. 4.

The switching apparatus 34 comprises a first actuation branch 36a for the actuation of the first comb drive 22a and a second actuation branch 36b for the actuation of the second comb drive 22b.

In addition, the switching apparatus 34 comprises a first elongation-detection branch 38a with which the first comb drive 22a can be connected for the generation of the first elongation signal P1, and a second elongation-detection branch 38b to which the second comb drive 22b can be connected for the generation of the second elongation signal P2.

An output of the first actuation branch 36a can be connected to the first comb drive 22a via a first actuation switch 40a. An output of the second actuation branch 36b can be connected to the second comb drive 22b via a second actuation switch 40b. The comb drives 22a and 22b are also connected to earth.

An input of the first elongation-detection branch 38a can be connected to the first comb drive 22a via a first elongation switch 42a. An input of the second elongation-detection branch 38b can be connected to the second comb drive 22b via a second elongation switch 42b.

The first actuation branch 36a is connected to the first signal generator 35a via the output of the actuation apparatus 32 for the first actuation signal AS1. The first signal generator 35a is connected to earth via a first ohmic resistor 48a, for example in the form of a shunt. A tap for the first comb current I1 is provided between the first signal generator 35a and the first resistor 48a, which comb current I1 is connected to the corresponding input of the comb position-detection apparatus 46.

The second actuation branch 36b is connected to the second signal generator 35b via the output of the actuation apparatus 32 for the second actuation signal AS2. The second signal generator 35b is connected to earth via a second ohmic resistor 48b, for example in the form of a shunt. A tap for the second comb current I2 is provided between the second signal generator 35b and the second resistor 48b, which comb current I2 is connected to the corresponding input of the comb position-detection apparatus 46.

An output of the first elongation-detection branch 38a is connected to an input of a first trans-impedance amplifier 44a of the elongation-detection apparatus 24. An output of the second elongation-detection branch 38b is connected to an input of a second trans-impedance amplifier 44b of the elongation-detection apparatus 24. A respective reference voltage Ref is present at the respective other inputs of the trans-impedance amplifiers 44a and 44b. The reference voltages Ref of the trans-impedance amplifiers 44a and 44b can be specified or can be capable of being set to be different or to be the same.

The first elongation signal P1, which is transmitted to the FPGA module 30, is present at the output of the first trans-impedance amplifier 44a. The second elongation signal P2, which is likewise transmitted to the FPGA module 30, is present at the output of the second trans-impedance amplifier 44b.

Figure 5:
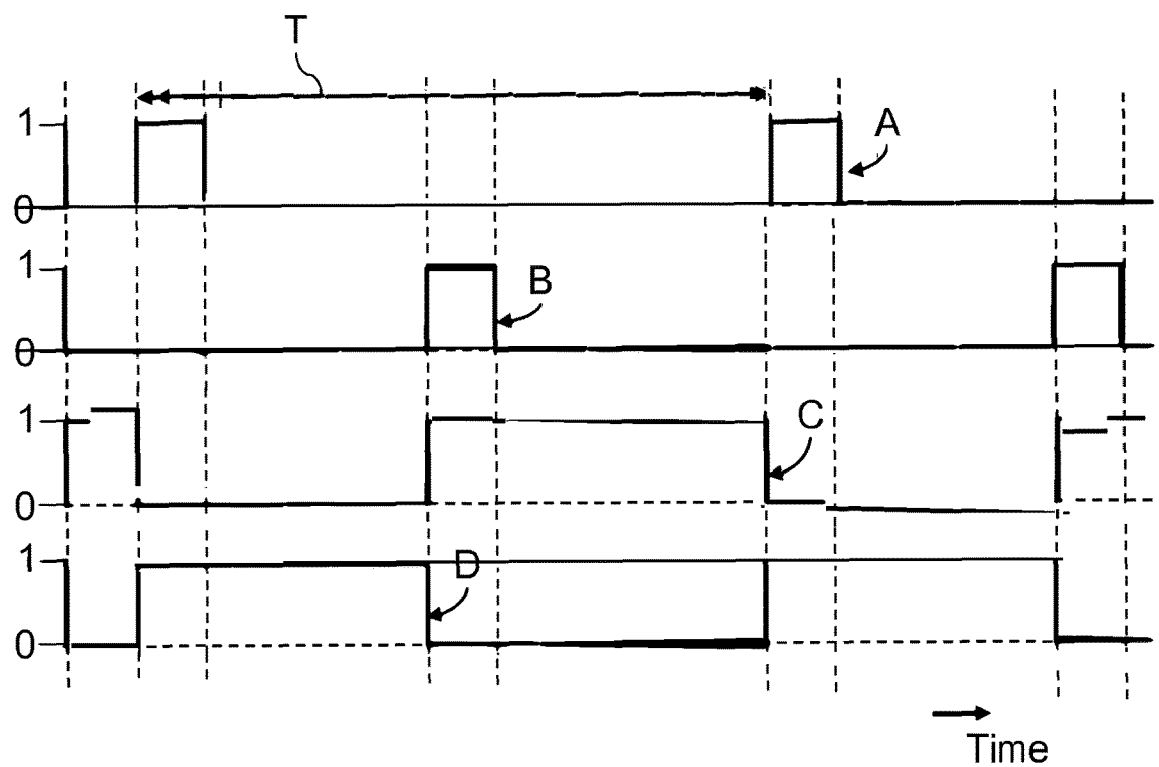
FIG. 5 shows time progressions of four switching signals with which the switching apparatus from FIG. 4 is switched.

The actuation switches 40a and 40b and the elongation switches 42a and 42b are connected to the respective outputs of the switching signal-generation device 33 at which the corresponding switching signals A, B, C and D are present. In this context, the first actuation switch 40a is connected to the first switching signal A, the second actuation switch 40b is connected to the second switching signal B, the first elongation switch 42a is connected to the third switching signal C, and the second elongation switch 42b is connected to the fourth switching signal D. A chronological portion of the switching signals A, B, C and D during approximately 1.5× the period length T of the oscillation of the micro-oscillation mirror 16 is shown in FIG. 5.

Using the switching signals A, B, C and D, the comb drives 22a and 22b are each connected alternately to the actuation apparatus 32 or to the elongation-detection apparatus 24 by means of the switching apparatus 34.

The switching signals A, B, C and D are periodic square-wave signals which each change between 0 and 1 with the period length T of the oscillation of the micro-oscillation mirror 16. If a switching signal is at 1, the corresponding switch is closed. If the switching signal is at 0, the corresponding switch is open.

The first switching signal A and the fourth switching signal D change simultaneously to 1, so that the first actuation switch 40a and the second elongation switch 42b are closed simultaneously.

The first switching signal A and the fourth switching signal D switch to 1 in accordance with the oscillation of the micro-oscillation mirror 16 as soon as the micro-oscillation mirror 16 exits a lower amplitude of its oscillation in FIG. 3, that is to say is located between the lower amplitude and a subsequent upper amplitude.

The first switching signal A switches to 0 as soon as the micro-oscillation mirror 16 passes through its zero position. While the first switching signal A is at 1, the first actuation signal AS1 of the first signal generator 35a is transmitted to the first comb drive 22a with the first actuation branch 36a, so that said comb drive 22a drives the micro-oscillation mirror 16.

The fourth switching signal D changes to 0 as soon as the micro-oscillation mirror 16 exits the upper amplitude of its oscillation. While the fourth switching signal D is at 1, the second comb drive 22b is connected via the second elongation-detection branch 38b to the second trans-impedance amplifier 44b of the elongation-detection apparatus 24, with which amplifier 44b the second elongation signal P2 is generated and transmitted to the FPGA module 30.

The second switching signal B and the third switching signal C switch to 1 in accordance with the oscillation period of the micro-oscillation mirror 16 as soon as the micro-oscillation mirror 16 exits an upper amplitude of its oscillation in FIG. 3, that is to say is located between the upper amplitude and a subsequent lower amplitude. In the embodiment, the second switching signal B and the third switching signal C switch to 1 as soon as the fourth switching signal D switches to 0.

The second switching signal B switches to 0 as soon as the micro-oscillation mirror 16 passes through the zero position of its oscillation. While the second switching signal B is at 1, the second actuation signal AS2 of the second signal generator 35b is transmitted to the second comb drive 22b with the second actuation branch 36b, so that said comb drive 22b drives the micro-oscillation mirror 16.

The third switching signal C changes to 0 as soon as the micro-oscillation mirror 16 exits the lower amplitude of its oscillation. While the third switching signal C is at 1, the first comb drive 22a is connected via the first elongation-detection branch 38a to the first trans-impedance amplifier 44a of the elongation-detection apparatus 24, with which amplifier 44a the first elongation signal P1 is generated and transmitted to the FPGA module 30.

By means of the periodic switching over of the comb drives 22a and 22b between the drive mode and the elongation-detection mode it is possible to continuously determine the elongation of the micro-oscillation mirror 16 using the elongation signals P1 and P2. In addition, the micro-oscillation mirror 16 can be driven at any arising edge and at any falling edge of its oscillation with one of the comb drives 22a or 22b. In this way, the transient recovery time of the micro-oscillation mirror 16 can be reduced without the supply of energy for each individual comb drive 22a and 22b having to be increased.

In addition, by means of the elongation signals P1 and P2, the actuation signals AS1 and AS2 and the switching signals A, B, C and D can be regulated in such a way that the micro-oscillation mirror 16 oscillates as far as possible at its resonant frequency.

After the transient recovery time of the micro-oscillation mirror 16, the switching signals A, B, C and D can be optionally changed in such a way that one of the comb drives, for example the first comb drive 22a, is always operated in the drive mode, and the other comb drive, for example the second comb drive 22b, is always operated in the elongation-detection mode. In this way, the micro-oscillation mirror 16 can be driven more economically in terms of energy in that only the energy which is necessary to maintain the oscillation of the micro-oscillation mirror 16 is supplied.

In addition, the position of the comb electrode structures of the respective comb drives 22a and 22b can be determined by measuring the comb currents I1 and I2 by means of the comb position-detection apparatus 46. In this context, the first comb current I1 can be measured against earth via the first resistor 48a when the first comb drive 22a is in the drive mode, that is to say the first actuation switch 40a is closed. The second comb current I2 can be measured against earth via the second resistor 48b when the first comb drive 22b is in the drive mode, that is to say the second actuation switch 40a is closed.

If the first comb drive 22a is in the drive mode, the first comb current I1 rises until the comb electrode structures of the first comb drive 22a engage completely with one inside the other. In this position, the comb capacitance of the first comb drive 22a is at its maximum. This is the ideal time to switch off the first actuation signal AS1 so that deceleration of the first comb drive 22a and therefore deceleration of the oscillation of the micro-oscillation mirror 16 are prevented.

Accordingly, in the drive mode of the second comb drive 22b the second comb current I2 rises until the comb electrode structures of the second comb drive 22a engage completely with one inside the other. Accordingly, the ideal time to switch off the second actuation signal AS2 is when the maximum of the comb capacitance of the second comb drive 22b is reached.

The signals from the comb currents I1 and I2 can be evaluated, for example, with an analogue/digital converter (ADC) and made available to the switching signal-generating device 33 for the setting of the switching signals A, B, C and D. The analogue/digital converter can be part of the FPGA module 30.

The control of the actuation signals AS1 and AS2 with the comb position-detection apparatus 46 by means of at least one of the comb currents I1 and I2 can also take place in operating situations in which the corresponding comb drive 22a and/or 22b is switched exclusively to the drive mode, that is to say not alternately to the drive mode or to the position-detection mode. In this context, both comb drives 22a and 22b can also be connected in the drive mode. In this way, when the actuation apparatus 20 starts, relatively fast transient recoveries of the micro-oscillation mirror 16 can be achieved.

In order to determine the resonant frequency of the micro-oscillation mirror 16, at least one of the comb drives 22a and 22b can be switched into the position-detection mode at regular or irregular intervals and connected to the elongation-detection apparatus 24. At least one of the comb drives 22a and 22b can be advantageously connected to the elongation-detection apparatus 24 after a specifiable or specified number of oscillation periods of the micro-oscillation mirror 16. The oscillation frequency of the micro-oscillation mirror can be approximated to its resonant frequency using the elongation-detection apparatus 24.

For example, when there is a symmetrical arrangement of the comb drives 22a and 22b with respect to the pivoting axis 18, the comb drives 22a and 22b are actuated by means of the corresponding actuation signals AS1 and AS2 to provide drive simultaneously. When there is an asymmetrical arrangement of the comb drives 22a and 22b with respect to the pivoting axis 18, the comb drives 22a and 22b can be actuated by means of the actuation signals AS1 and AS2 to provide drive with staggered timing, in order to compensate for the asymmetrical arrangement.

The invention claimed is:

1. A method for controlling a drive apparatus of a micro-oscillation mirror, wherein the drive apparatus has at least two comb drives which are arranged on different radial sides of a pivoting axis of the micro-oscillation mirror, the method comprising:
   generating at least two actuation signals;
   actuating the at least two comb drives at least temporarily so as to drive the micro-oscillation mirror in an oscillating fashion;

generating at least one elongation signal, which characterizes the elongation of the micro-oscillation mirror using at least one comb drive; and adapting at least one of the actuation signals to the oscillation of the micro-oscillation mirror on a basis of at least one of the elongation signals, wherein at least one of the comb drives is connected, by at least one switching apparatus, alternately to an actuation apparatus for receiving at least one actuation signal or to an elongation-detection apparatus for generating at least one elongation signal.

2. The method according to claim 1, wherein one of the at least two comb drives is alternately connected to an actuation apparatus, while another one of the at least two comb drives is connected to an elongation-detection apparatus, and vice versa.

3. The method according to claim 1, wherein at least one switching signal is generated or specified, with which signal the at least one switching apparatus is switched.

4. The method according to claim 1, wherein, the connections between the at least one comb drive, on the one hand, and the actuation apparatus or the elongation-detection apparatus, on the other, are switched as a function of at least one elongation signal.

5. The method according to claim 1, wherein at least one comb drive is alternately connected to an actuation branch, allocated thereto, of the actuation apparatus, or, under certain circumstances, to an elongation-detection branch, allocated to this comb drive, of the elongation-detection apparatus.

6. The method according to claim 1, wherein at least one comb drive is actuated with at least one actuation signal between two amplitudes of the oscillation of the micro-oscillation mirror.

7. The method according to claim 1, wherein at least one comb drive is actuated with at least one actuation signal in a driving fashion until a measurement variable following the actuation signal reaches a specifiable limiting value.

8. The method according to claim 1, wherein after a transient recovery time of the micro-oscillation mirror at least one of the comb drives is used exclusively to drive the micro-oscillation mirror, and at least one of the comb drives is used exclusively to detect the elongation of the micro-oscillation mirror.

9. The method according to claim 1, wherein while at least one comb drive is actuated in a driving fashion with at least one actuation signal, an electric comb current of the at least one comb drive is determined as a variable which characterizes a position of comb electrode structures of the at least one comb drive.

10. A control device for controlling at least one drive apparatus of a micro-oscillation mirror, wherein the at least one drive apparatus has at least two comb drives which are arranged on different radial sides of a pivoting axis of the micro-oscillation mirror, the control device comprising:

at least one actuation apparatus for actuating the at least two comb drives using actuation signals;

at least one elongation-detection apparatus with which at least one elongation signal which characterizes the elongation of the micro-oscillation mirror is determined; and at least one apparatus which is connected in a controllable fashion to the at least one actuation apparatus such that at least one of the actuation signals is adapted to an oscillation frequency of the micro-oscillation mirror on a basis of at least one of the elongation signals, wherein the control device has at least one switching apparatus with which at least one comb drive is alternately connected to the at least one actuation apparatus or to the at least one elongation-detection apparatus.

11. The control device according to claim 10, wherein at least one switching apparatus has at least one switch and the control device has at least one switching signal-generating device with which at least one switching signal for switching the at least one switch is generated.

12. A deflector mirror apparatus of an optical detection apparatus, comprising:

at least one micro-oscillation mirror;

at least one drive apparatus for the at least one micro-oscillation mirror, wherein the drive apparatus has at least two comb drives which are arranged on different radial sides of a pivoting axis of the micro-oscillation mirror; and a control device for controlling the at least one drive apparatus, wherein the control device comprises:

at least one actuation apparatus for actuating the at least two comb drives using actuation signals, at least one elongation-detection apparatus with which at least one elongation signal which characterizes the elongation of the micro-oscillation mirror is determined, and at least one apparatus which is connected in a controllable fashion to the at least one actuation apparatus such that at least one of the actuation signals are adapted to an oscillation frequency of the micro-oscillation mirror on a basis of at least one of the elongation signals, wherein the control device has at least one switching apparatus with which at least one comb drive is alternately connected to the at least one actuation apparatus or to the at least one elongation-detection apparatus.

13. The control device according to claim 10, wherein the least one actuation apparatus comprises a plurality of signal generators configured to generate the actuation signals.

14. The control device according to claim 10, further comprising a comb position-detection apparatus configured to determine a position of comb electrode structures of the at least one comb drive by measuring an electric comb current of the at least one comb drive.

* * * * *